United States Patent
Tsutsumi et al.

(10) Patent No.: US 12,206,014 B2
(45) Date of Patent: Jan. 21, 2025

(54) FIELD-EFFECT TRANSISTOR AND METHOD FOR MANUFACTURING THE SAME

(71) Applicant: Nippon Telegraph and Telephone Corporation, Tokyo (JP)

(72) Inventors: Takuya Tsutsumi, Tokyo (JP); Hideaki Matsuzaki, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 244 days.

(21) Appl. No.: 17/779,838

(22) PCT Filed: Nov. 29, 2019

(86) PCT No.: PCT/JP2019/046766
§ 371 (c)(1),
(2) Date: May 25, 2022

(87) PCT Pub. No.: WO2021/106190
PCT Pub. Date: Jun. 3, 2021

(65) Prior Publication Data
US 2023/0006053 A1    Jan. 5, 2023

(51) Int. Cl.
*H01L 29/66* (2006.01)
*H01L 29/812* (2006.01)

(52) U.S. Cl.
CPC ...... *H01L 29/66848* (2013.01); *H01L 29/812* (2013.01)

(58) Field of Classification Search
CPC ... H01L 29/778–7789; H01L 29/66462; H01L 29/66431; H01L 2924/13064; H01L 29/122–127; H01L 29/15–158
See application file for complete search history.

(56) References Cited

U.S. PATENT DOCUMENTS

| 5,181,087 | A | 1/1993 | Usagawa et al. |
| 6,274,893 | B1* | 8/2001 | Igarashi ............... H01L 29/1029 257/E29.05 |
| 2006/0148182 | A1* | 7/2006 | Datta ................ H01L 29/66871 257/E21.453 |

(Continued)

FOREIGN PATENT DOCUMENTS

| JP | S62213173 A | 9/1987 |
| JP | H0496337 A | 3/1992 |

(Continued)

OTHER PUBLICATIONS

Suemitsu, T. et al., "Improved Recessed-Gate Structure for Sub-0.1-μm-Gate InP-Based High Electron Mobility Transistors," Japanese Journal of Applied Physics, vol. 37, No. 3B, Mar. 1998, 9 pages.

*Primary Examiner* — Evren Seven
*Assistant Examiner* — Cole Leon Lindsey
(74) *Attorney, Agent, or Firm* — Slater Matsil, LLP

(57) ABSTRACT

A gate electrode includes a main portion formed of a gate electrode material, and a gate electrode barrier layer disposed between the main portion and a barrier layer and formed of a conductive material that prevents the gate electrode material from diffusing into the barrier layer. A surface of the main portion in a region above a first insulating layer faces a periphery without a layer of the conductive material being formed.

16 Claims, 14 Drawing Sheets

(56) References Cited

U.S. PATENT DOCUMENTS

| | | | |
|---|---|---|---|
| 2010/0102358 A1 | 4/2010 | Lanzieri et al. | |
| 2010/0176421 A1 | 7/2010 | Van Hove et al. | |
| 2012/0319169 A1 | 12/2012 | Van Hove | |
| 2013/0161709 A1* | 6/2013 | Endoh | H01L 29/7784 |
| | | | 257/E21.409 |

FOREIGN PATENT DOCUMENTS

| | | |
|---|---|---|
| JP | 2010506397 A | 2/2010 |
| JP | 2010533987 A | 10/2010 |
| JP | 2013012735 A | 1/2013 |
| JP | 2013131650 A | 7/2013 |

* cited by examiner

FIELD-EFFECT TRANSISTOR AND METHOD FOR MANUFACTURING THE SAME

CROSS-REFERENCE TO RELATED APPLICATIONS

This patent application is a national phase filing under section 371 of PCT application no. PCT/JP2019/046766, filed on Nov. 29, 2019, which application is hereby incorporated herein by reference in its entirety.

TECHNICAL FIELD

The present invention relates to a field effect transistor and a method of manufacturing the same.

BACKGROUND

Properties of terahertz waves, which are in an electromagnetic wave frequency band of 0.3 to 3.0 THz, have the potential to create new applications that have not been present before, such as high-speed wireless communication exceeding tens of Gb/s, non-destructive internal inspection based on three-dimensional imaging, and component analysis using electromagnetic wave absorption.

When an application using terahertz waves is realized, better high-frequency characteristics are also required for an electronic device constituting the application. Generally, a field effect transistor formed of a compound semiconductor having particularly high electron mobility in terms of physical properties is used as an electronic device having good high-frequency characteristics.

The field effect transistor described above includes a semiconductor substrate, a semiconductor stacked structure formed on the semiconductor substrate, a gate electrode formed on a surface of the semiconductor stacked structure, and a source electrode and a drain electrode formed on both sides of the gate electrode. In particular, a high electron mobility transistor having excellent high-frequency characteristics includes a buffer layer, a channel layer, a barrier layer, a stopper layer, a cap layer, and a passivation layer sequentially stacked on the semiconductor substrate. Further, a carrier supply layer is formed on the barrier layer side or on the buffer layer side with respect to the channel layer. In this configuration, a position of the carrier supply layer or the amount of doping of impurities is designed according to a design of element characteristics.

In this type of field effect transistor, when a potential is applied to the gate electrode, a concentration of two-dimensional electron gas formed by carriers being supplied from the carrier supply layer to the channel layer is modulated according to an intensity of the applied potential, and electrons move through a conduction channel formed between the source electrode and the drain electrode. The carrier supply layer and the channel layer in which the conduction channel through which the electrons (carriers) move (travel) is formed are spatially separated, and scattering due to impurities in the carrier supply layer is curbed. Thus, in the above-described field effect transistor, electron mobility can be improved and high-frequency operation can be realized.

Examples of applications of the above-described field effect transistor to a high-frequency circuit may include good high-frequency characteristics of the transistor alone. Further, from a viewpoint of practical use, long-term reliability of the field effect transistor is required. In order to improve the high-frequency characteristics of the field effect transistor, it is effective to have a fine gate length, reduce a parasitic capacitance, and reduce a gate resistance at the time of a high-frequency operation. In particular, in order to reduce the gate resistance at the time of the high-frequency operation, it is important to employ a material having high conductivity for the gate electrode.

On the other hand, in order to improve reliability of the field effect transistor, a portion of the gate electrode in contact with the barrier layer is formed of a conductive material containing a metal that does not easily diffuse into a semiconductor so that mutual diffusion is prevented between the gate electrode and the barrier layer to which a voltage is always applied. Examples of such a metal include a high melting point metal such as tungsten or molybdenum. Further, a nitride of such a metal, for example, is used as the above-described conductive material.

However, while this type of conductive material does not easily diffuse into a semiconductor, a conductivity thereof is not very high (resistivity is high). In particular, in a high-frequency operation, a so-called skin effect in which an applied signal propagates only on a surface of the gate electrode becomes a problem in a gate electrode for which such a kind of conductive material is used. Because the skin effect becomes remarkable particularly at high frequencies, characteristics of a high-frequency circuit are greatly impaired.

Thus, when this kind of conductive material is used for the gate electrode, a layer of, for example, gold having high conductivity, in addition to a layer of a conductive material used for preventing diffusion, is stacked as the gate electrode. For example, a layer proximate to the barrier layer is formed of tungsten silicide, and a layer formed of a highly conductive metal material containing platinum or gold is formed as a gate electrode on the tungsten silicide layer.

CITATION LIST

Non Patent Literature

NPL 1: T. Suemitsu et al., "Improved Recessed-Gate Structure for Sub-0.1-μm-Gate InP-Based High Electron Mobility Transistors," Japanese Journal of Applied Physics, Vol. 37, Part 1, no. 3B, pp. 1365-1372, 1998.

SUMMARY

Technical Problem

However, in the above-described related art, because a portion of a conductive material containing a high melting point metal such as tungsten or molybdenum is not removed from the gate electrode, the gate resistance is increased due to the skin effect as described above in the portion of the conductive material, which impairs high-frequency characteristics.

Embodiments of the present invention have been made to solve the above problem, and an object of embodiments of the present invention is to curb a skin effect in a gate electrode formed of a conductive material containing a high melting point metal.

Means for Solving the Problem

A method of manufacturing a field effect transistor according to embodiments of the present invention includes a first step of forming a buffer layer, a channel layer, a barrier layer, a carrier supply layer, and a cap layer on a semiconductor substrate; a second step of forming a source electrode and a drain electrode apart from each other on the cap layer; a third step of forming a first insulating layer and a second insulating layer in this order on the cap layer between the source electrode and the drain electrode; a fourth step of forming a first opening in the first insulating layer and forming a second opening in the second insulating layer, the second opening being continuous to the first opening in a thickness direction; a fifth step of etching the cap layer using the first insulating layer including the first opening and the second insulating layer including the second opening as masks, and forming a recessed region in the cap layer under the first opening, the recessed region being formed by partially removing the cap layer in a direction of the source electrode and a direction of the drain electrode from the first opening in a plan view; a sixth step of depositing a conductive material preventing a gate electrode material from diffusing into the barrier layer and the gate electrode material in this order from above the second insulating layer, thereby forming a gate electrode, the gate electrode being disposed above the first insulating layer, being fitted partially into the recessed region through the first opening, and including a main portion and a gate electrode barrier layer, the main portion being formed of the gate electrode material, the gate electrode barrier layer being disposed between the main portion and the barrier layer and formed of the conductive material; a seventh step of removing the second insulating layer; and an eighth step of removing the layer of the conductive material formed on a surface of the main portion in a region above the first insulating layer.

Further, a field effect transistor according to embodiments of the present invention includes a buffer layer, a channel layer, a barrier layer, a carrier supply layer, and a cap layer formed on a semiconductor substrate; a source electrode and a drain electrode formed apart from each other on the cap layer; an insulating layer formed on the cap layer between the source electrode and the drain electrode and including an opening; and a gate electrode disposed between the source electrode and the drain electrode, wherein a recessed region is formed in the cap layer, the recessed region being formed by partially removing the cap layer in a direction of the source electrode and a direction of the drain electrode from the opening in a plan view, the gate electrode is disposed above the insulating layer and partially fitted into the recessed region through the opening, the gate electrode includes a main portion formed of a gate electrode material, and a gate electrode barrier layer disposed between the main portion and the barrier layer and formed of a conductive material that prevents the gate electrode material from diffusing into the barrier layer, and a surface of the main portion in a region above the insulating layer faces a periphery without the conductive material being formed.

Effects of Embodiments of the Invention

As described above, according to embodiments of the present invention, the gate electrode includes the main portion formed of the gate electrode material, and the gate electrode barrier layer formed of the conductive material that prevents the gate electrode material from diffusing into the barrier layer, and the surface of the main portion in the region above the insulating layer faces the periphery without the conductive material being formed. Thus, a skin effect in the gate electrode formed of the conductive material containing the high melting point metal can be curbed.

DETAILED DESCRIPTION OF ILLUSTRATIVE EMBODIMENTS

Hereinafter, field effect transistors according to embodiments of the present invention and methods of manufacturing the same will be described.

First Embodiment

First, a method of manufacturing a field effect transistor according to a first embodiment of the present invention will be described with reference to FIGS. 1A to 1I. FIGS. 1A to 1I illustrate cross sections parallel to a gate length direction.

Figure 1A:
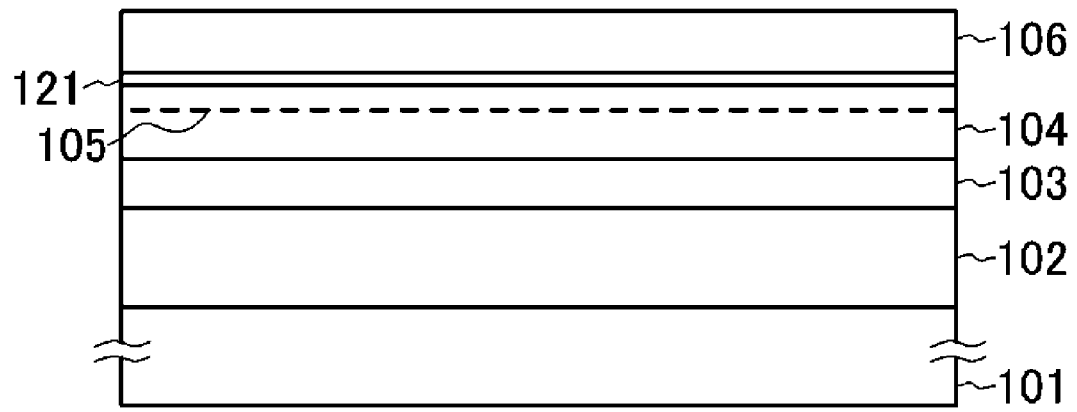
FIG. 1A is a cross-sectional view illustrating a cross section of an element in an intermediate step to describe a method of manufacturing a field effect transistor according to a first embodiment of the present invention.

First, as illustrated in FIG. 1A, a buffer layer 102, a channel layer 103, a barrier layer 104, a carrier supply layer 105, and a cap layer 106 are formed on a semiconductor substrate 101 formed of, for example, semi-insulating InP (first step).

For example, the buffer layer 102 having a layer thickness of 100 to 300 nm and formed of InAlAs, the channel layer 103 having a layer thickness of 5 to 20 nm and formed of InGaAs, the barrier layer 104 having a layer thickness of 5 to 20 nm and formed of InAlAs, and the cap layer 106 formed of InGaAs and doped with Si at $1\times10^{19}$ to $2\times10^{19}$ cm$^{-3}$ are sequentially stacked on the semiconductor substrate 101 through crystal growth using an organic metal vapor phase growth method, a molecular beam epitaxy method, or the like. Further, the carrier supply layer 105 doped with Si at $1\times10^{19}$ cm$^{-3}$ as impurities is formed in the barrier layer 104 by a well-known sheet doping method. Further, in the first embodiment, a stopper layer 121 formed of InP and having a layer thickness of 2 to 5 nm is formed between the carrier supply layer 105 and the cap layer 106.

Figure 1B:
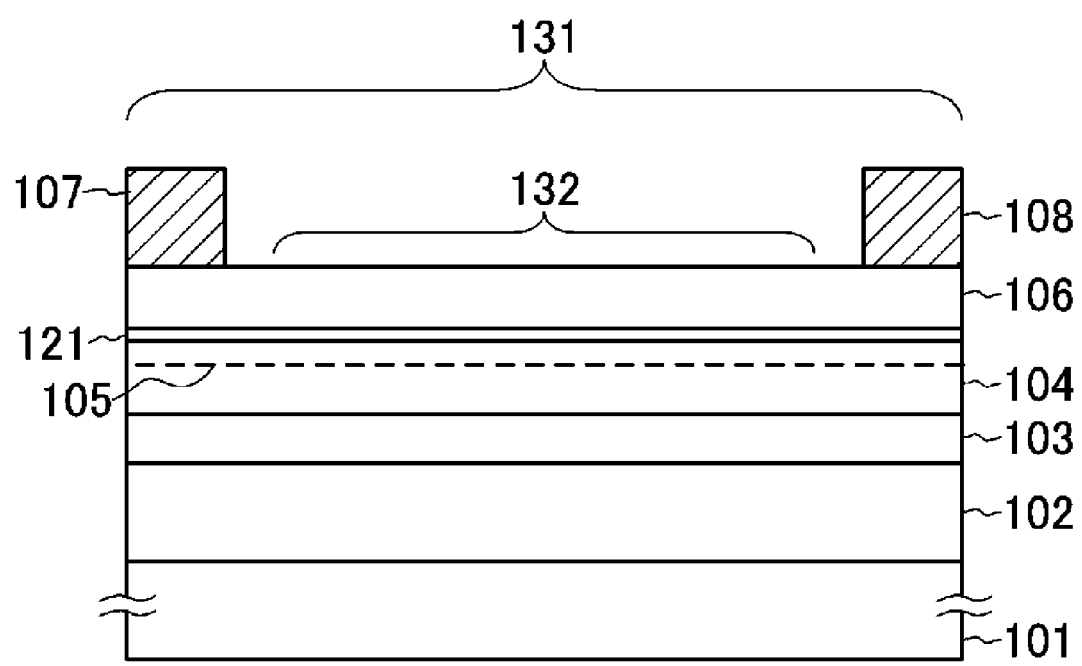
FIG. 1B is a cross-sectional view illustrating a cross section of the element in an intermediate step to describe the method of manufacturing the field effect transistor according to the first embodiment of the present invention.

Then, as illustrated in FIG. 1B, a mesa region 131 is formed by patterning using wet etching or dry etching for isolation between elements. Subsequently, a source electrode 107 and a drain electrode 108 are formed apart from each other on the cap layer 106 (a second step). The source electrode 107 and the drain electrode 108 are formed with a recess formation region 132, in which the recessed region is formed, interposed therebetween. For example, Ti/Pt/Au is deposited on the cap layer 106 so that a metal film is formed, and the metal film is patterned using a known photolithography technology and etching technology so that the source electrode 107 and the drain electrode 108 are formed. Further, it is possible to form the source electrode 107 and the drain electrode 108 using a known lift-off method. The source electrode 107 and the drain electrode 108 are ohmically bonded to the cap layer 106.

Figure 1C:
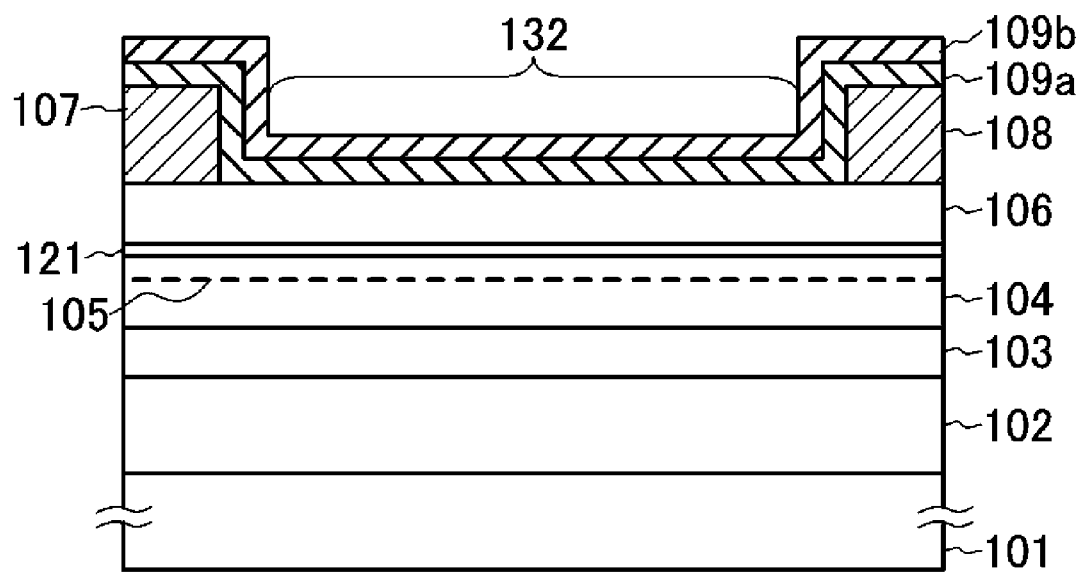
FIG. 1C is a cross-sectional view illustrating a cross section of the element in an intermediate step to describe the method of manufacturing the field effect transistor according to the first embodiment of the present invention.

Then, as illustrated in FIG. 1C, a first insulating layer 109a and a second insulating layer 109b are formed in this order on the cap layer 106 between the source electrode 107 and the drain electrode 108 (a third step). Here, the first insulating layer 109a and the second insulating layer 109b are formed to also cover the source electrode 107 and the drain electrode 108. For example, using a well-known plasma CVD method or the like, silicon oxide (SiO$_2$) is deposited, so that the first insulating layer 109a is formed, and a silicon nitride (SiN$_x$) is deposited, so that the second insulating layer 109b is formed. The first insulating layer 109a is formed, for example, to have a thickness of 10 to 100 nm. The second insulating layer 109b is formed to have a thickness of 10 to 100 nm.

Figure 1D:
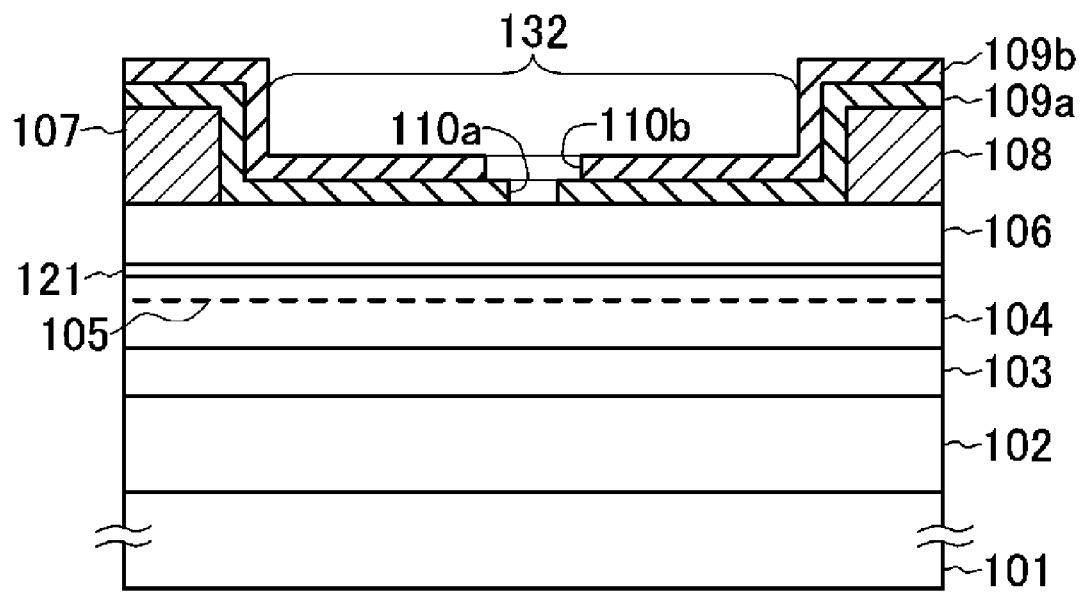
FIG. 1D is a cross-sectional view illustrating a cross section of the element in an intermediate step to describe the method of manufacturing the field effect transistor according to the first embodiment of the present invention.

Then, as illustrated in FIG. 1D, a first opening 110a is formed in the first insulating layer 109a, and a second opening 110b continuous to the first opening 110a in a thickness direction is formed in the second insulating layer 109b (a fourth step). Here, an opening width of the second opening 110b in the gate length direction is larger than an opening width of the first opening 110a in the gate length direction. Further, the opening width of the second opening 110b in a gate width direction is the same as or larger than the opening width of the first opening 110a in the gate width direction. The first opening 110a is called a gate opening for forming a so-called recessed gate structure.

For example, the first insulating layer 109a is formed, and then the second insulating layer 109b is formed using a known electron beam lithography technology and etching technology.

Figure 1E:
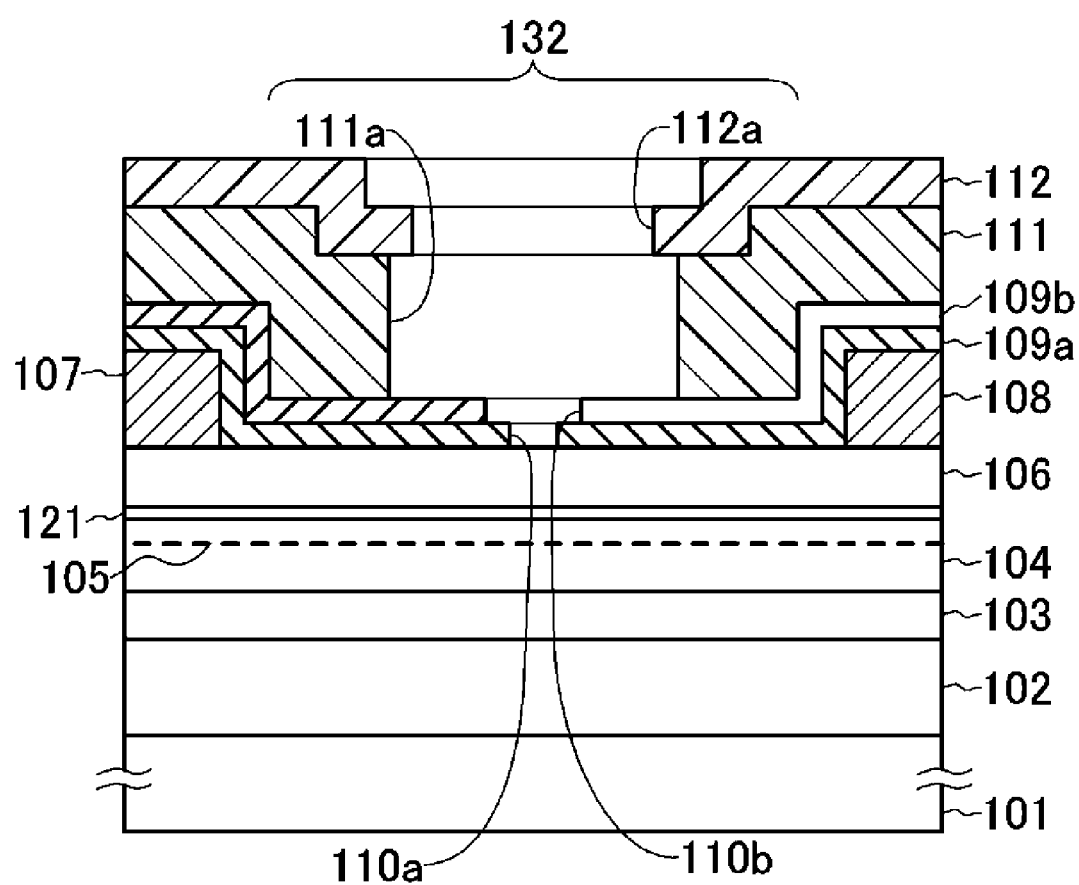
FIG. 1E is a cross-sectional view illustrating a cross section of the element in an intermediate step to describe the method of manufacturing the field effect transistor according to the first embodiment of the present invention.

Then, as illustrated in FIG. 1E, a first mask pattern 111 is formed, and a second mask pattern 112 is formed on the first mask pattern 111. The first mask pattern 111 includes a first mask opening 111a, and the second mask pattern 112 includes a second mask opening 112a. The second mask opening 112a has the same shape (for example, a rectangle) as a shape in a plan view of an upper portion of the gate electrode 114 to be formed in a plan view. In other words, the second mask opening 112a defines a formation region of the gate electrode 114 in a plan view. Further, the first mask opening 111a has a larger area than the second mask opening 112a in a plan view. These can be formed by a known photolithography technology or electron beam lithography technology.

Figure 1F:
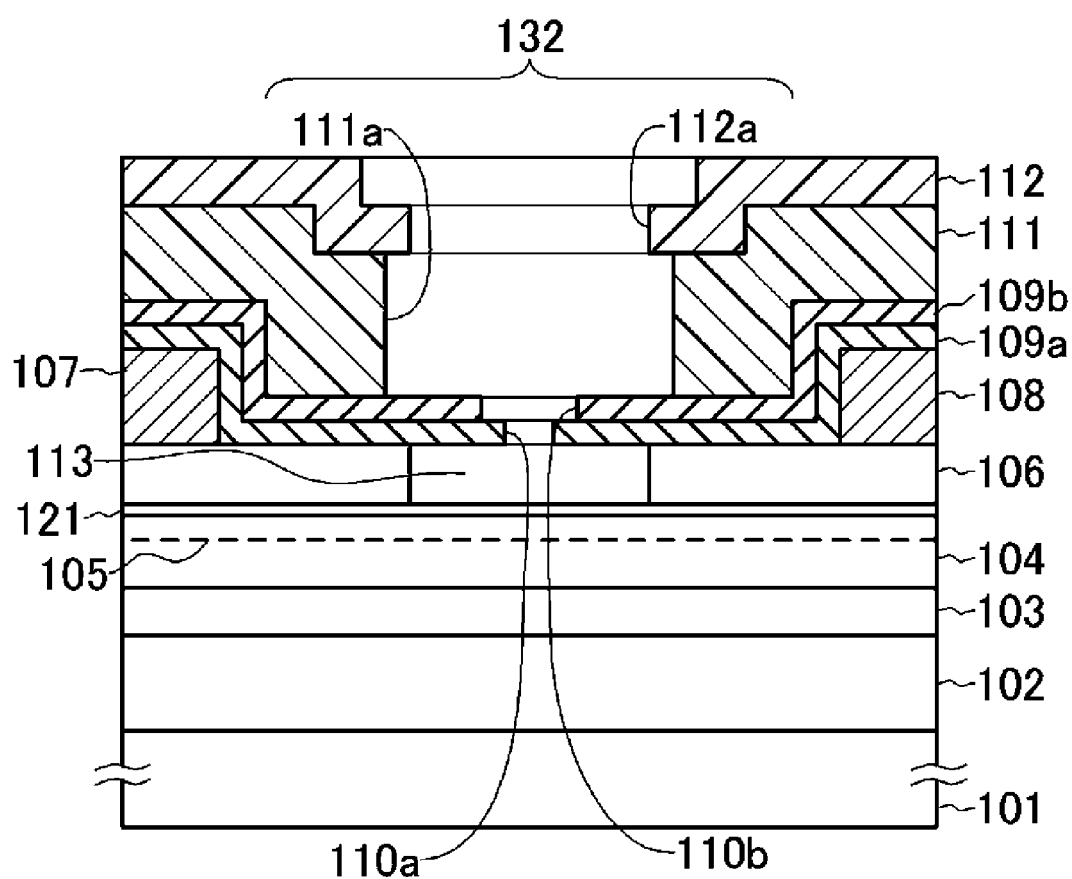
FIG. 1F is a cross-sectional view illustrating a cross section of the element in an intermediate step to describe the method of manufacturing the field effect transistor according to the first embodiment of the present invention.

Then, the cap layer 106 is etched with the first insulating layer 109a including the first opening 110a and the second insulating layer 109b including the second opening 110b as masks, so that a recessed region 113 is formed as illustrated in FIG. 1F (a fifth step). In this etching processing, an etchant is caused to selectively act on the cap layer 106 via the first opening 110a and the second opening 110b, and the cap layer 106 is partially removed in a direction of the source electrode 107 and a direction of the drain electrode 108 from the first opening 110a in a plan view. Through this etching processing, the recessed region 113 is formed in the cap layer 106 under the first opening 110a.

For example, an etching solution is caused to penetrate from the first opening 110a and the second opening 110b by wet etching using an etching solution such as citric acid as an etchant, so that the cap layer 106 is isotropically etched. In this etching, the etching solution erodes the cap layer 106 from the first opening 110a and the second opening 110b, and lateral spread of the etching forms the recessed region 113 which is one continuous space. Further, when the stopper layer 121 formed of InP is formed, the InP is not substantially etched by a citric acid-based etching solution, and thus the InP serves as an etching stop layer (a stopper layer), which can prevent the barrier layer 104 from being etched. The source electrode 107 and the drain electrode 108 may be formed after the recessed region 113 is formed, and an order of manufacturing these portions is within consideration of transistor manufacturing processes.

Figure 1G:
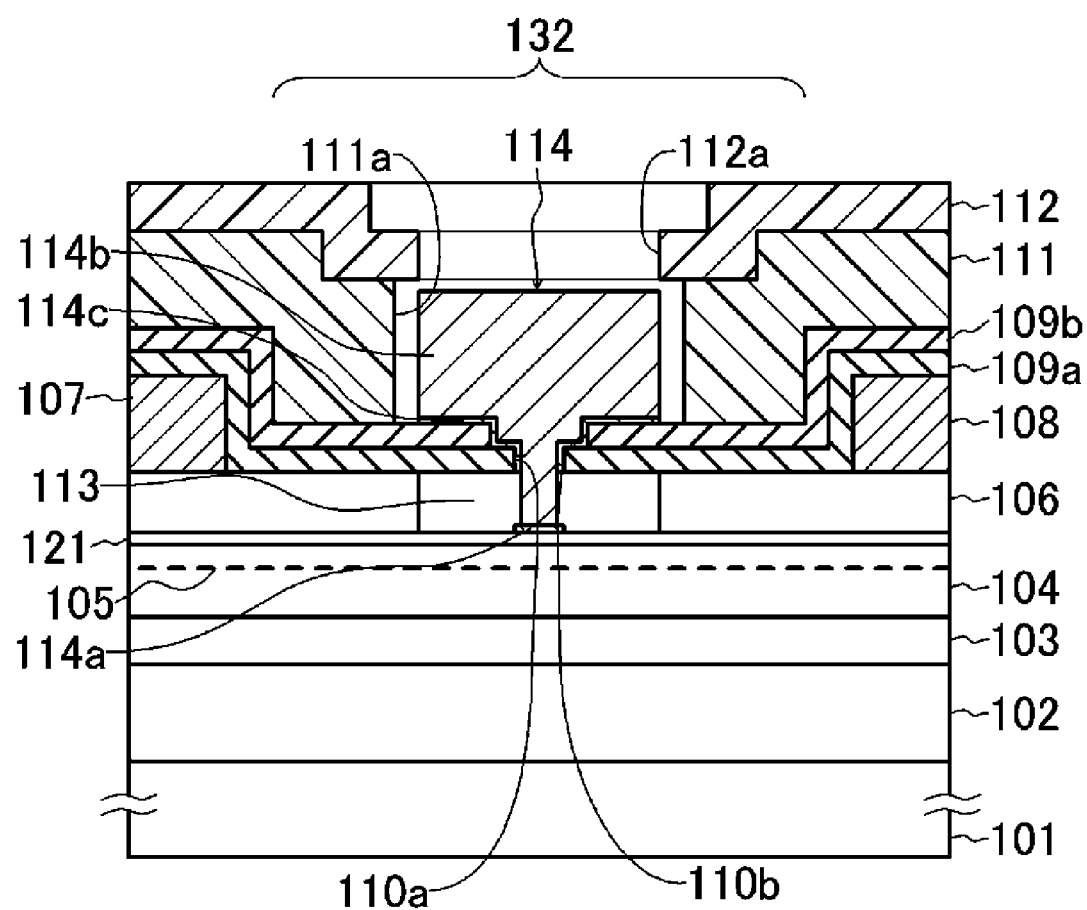
FIG. 1G is a cross-sectional view illustrating a cross section of the element in an intermediate step to describe the method of manufacturing the field effect transistor according to the first embodiment of the present invention.

Then, as illustrated in FIG. 1G, the gate electrode 114 disposed on the first insulating layer 109a (the second insulating layer 109b) and partially fitted into the recessed region 113 from the first opening 110a is formed (a sixth step). Here, the gate electrode 114 includes a main portion 114b formed of a gate electrode material, and a gate electrode barrier layer 114a disposed between the main portion 114b and the barrier layer 104 and formed of a conductive material that prevents the gate electrode material from diffusing into the barrier layer 104. In the first embodiment, a structure is described in which the gate electrode 114 is Schottky-connected to the barrier layer 104.

In this step, the first mask pattern 111 and the second mask pattern 112 are used as masks, and the conductive material and the gate electrode material are deposited in this order from above the second insulating layer 109b. Thus, the gate electrode 114 including the gate electrode barrier layer 114a formed of the conductive material below the first insulating layer 109a, and the main portion 114b formed of the gate electrode material above the first insulating layer 109a is formed.

For example, the conductive material can be formed of a high melting point metal such as molybdenum or tantalum. The gate electrode material can be formed of platinum or gold. For example, titanium, molybdenum, platinum, and gold are deposited in this order using a vacuum vapor deposition method. Each material to be vapor-deposited enters through the second mask opening 112a of the second mask pattern 112 toward the cap layer 106 and is deposited in a range that can be seen through the second mask opening 112a from above.

First, titanium and a conductive material are deposited on a surface of the second insulating layer 109b in a range that can be seen from above through the second mask opening 112a and a side surface of the second opening 110b. Further, the titanium and the conductive material are deposited on a surface of the first insulating layer 109a that can be seen from above through the second opening 110b and a side surface of the first opening 110a. Thus, a conductive layer (a layer of a conductive material) 114c is formed. Further, the titanium and the conductive material are deposited on the stopper layer 121 (the barrier layer 104) that can be seen from above through the first opening 110a. The gate electrode barrier layer 114a is formed by this deposition. A deposition amount of the conductive material is appropriately controlled so that the gate electrode barrier layer 114a is formed to be thin to the extent that the diffusion of the gate electrode material can be prevented. Although not illustrated in the drawings, a metal (a conductive material) that has been deposited and has entered the recessed region 113 through the first opening 110a penetrates the ultra-thin stopper layer 121 and is Schottky-connected to the barrier layer 104 that can be viewed (seen) through the first opening 110a.

Further, platinum and gold vapor-deposited following the conductive material are deposited on the second insulating layer 109b in a range that can be seen from above through the second mask opening 112a and on the side surface of the second opening 110b. Further, the platinum and the gold are deposited on the first insulating layer 109a that can be seen from above through the second opening 110b and on the side surface of the first opening 110a. In addition, the platinum and the gold are deposited on the stopper layer 121 (the barrier layer 104) (on the gate electrode barrier layer 114a) that can be seen from above through the first opening 110a. Thus, the main portion 114b is formed.

Here, when a vacuum vapor deposition method is used, the deposition is performed under a condition that the second mask pattern 112 and the first mask pattern 111 that are formed of a resist material are not burned out due to radiant heat. From this viewpoint, the conductive material is preferably formed of molybdenum. The deposition method of each material described above is not limited to the vacuum vapor deposition method, and a sputtering method can also be used.

In the sputtering method, because the deposition is performed by causing radicals to physically collide with a target, thermal damage to the resists of the second mask pattern 112 and the first mask pattern 111 is relatively low, and there are many types of applicable metal species. However, when the dimensions of the second mask opening 112a are fine, the second mask opening 112a may be blocked by a deposit in the sputtering method. On the other hand, in the vacuum vapor deposition method, even when the dimensions of the second mask opening 112a are fine, the deposit can reach the recessed region 113 without blocking the second mask opening 112a, which is advantageous to achieve a fine structure.

Figure 1H:
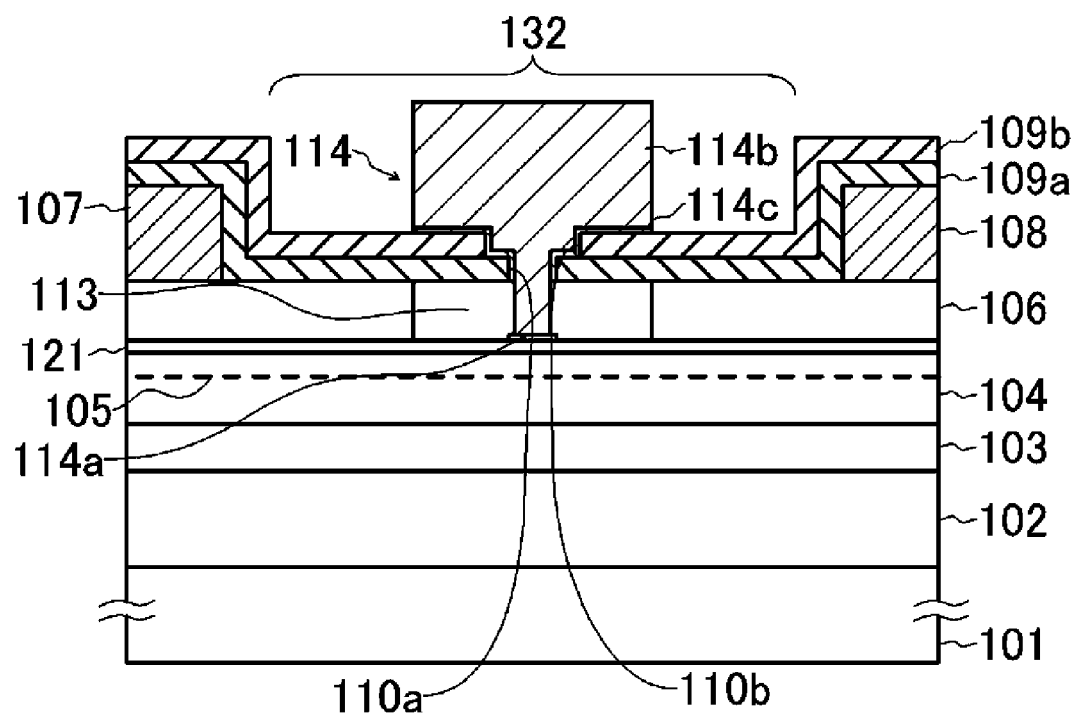
FIG. 1H is a cross-sectional view illustrating a cross section of the element in an intermediate step to describe the method of manufacturing the field effect transistor according to the first embodiment of the present invention.

Then, the first mask pattern 111 and the second mask pattern 112 are removed (FIG. 1H). For example, an organic solvent is used to dissolve the first mask pattern 111 and the second mask pattern 112 in the organic solvent, so that the first mask pattern 111 and the second mask pattern 112 can be removed. The series of processes from the first mask pattern 111 and the second mask pattern 112 described above is typically well known as a lift-off method.

Here, as is well known, an opening pattern can be easily formed in a fine shape having a nanometer size, and an opening width of the first opening 110a in the gate length direction is a fine dimension having a nanometer size. Thus, the gate electrode 114 in which the Schottky connection has a fine dimension in the gate length direction can be achieved, and good high-frequency characteristics can be achieved. A gate length is typically 10 to 100 nm.

A channel directly below the Schottky connection is modulated with a potential applied to the gate electrode 114 Schottky-connected to the barrier layer 104. As described above, in the first embodiment, the gate electrode barrier layer 114a is formed to prevent the gate electrode material from diffusing toward the barrier layer 104, thereby achieving high reliability of the field effect transistor.

Figure 1I:
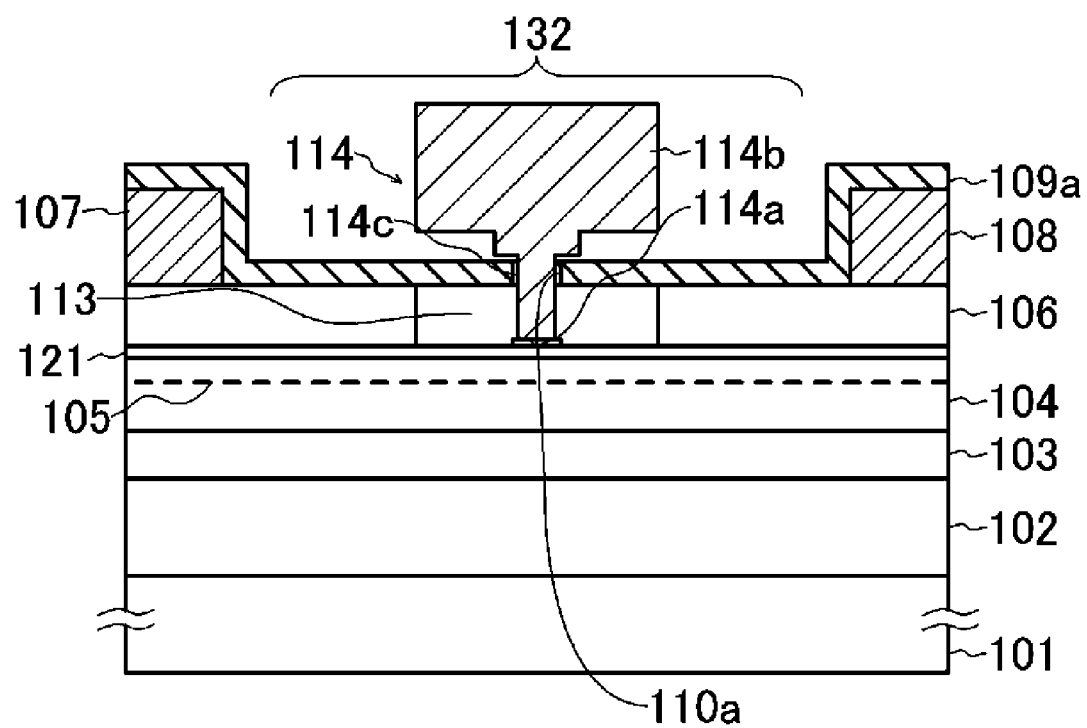
FIG. 1I is a cross-sectional view illustrating a cross section of the element in an intermediate step to describe the method of manufacturing the field effect transistor according to the first embodiment of the present invention.

On the other hand, a conductive layer 114c is formed on a side surface of a portion of the main portion 114b together with the formation of the gate electrode barrier layer 114a. The conductive layer 114c has a higher resistivity than the main portion 114b. In a state in which the conductive layer 114c is formed, a skin effect at the time of application of a high frequency causes deterioration of the high-frequency characteristics. Thus, the second insulating layer 109b is removed (a seventh step), and the conductive layer 114c formed on the surface of the main portion 114b in the region above the first insulating layer 109a is removed (an eighth step). As a result, as illustrated in FIG. 1I, it is possible to achieve a state in which the conductive layer 114c is not formed on the surface of the main portion 114b except for the inside of the first opening 110a of the first insulating layer 109a.

The above-described removal of the conductive layer 114c can be performed by, for example, plasma etching using a fluorine-based gas such as $SF_6$, $CF_4$, or $C_2F_6$. Through this etching processing, the second insulating layer 109b can also be removed together with the removal of the conductive layer 114c. Such simultaneous removal of both can shorten a throughput (step).

In this etching processing, an etching rate of the silicon nitride is about 2 to 5 times faster than that of the silicon oxide. Thus, the second insulating layer 109b formed of the silicon nitride is selectively removed, and the first insulating layer 109a formed of the silicon oxide remains without being removed. Further, the first insulating layer 109a can also be used as a protective layer of layers below the first insulating layer 109a. Further, because the silicon nitride having a high relative permittivity is removed, a parasitic capacitance between the gate electrode and the source/drain electrode can be reduced and high-frequency characteristics can be further improved.

The field effect transistor manufacturing method described above makes it possible to obtain the field effect transistor having a so-called recessed gate structure, which includes the buffer layer 102, the channel layer 103, the barrier layer 104, the carrier supply layer 105, and the cap layer 106 formed on the semiconductor substrate 101, the source electrode 107 and the drain electrode 108 formed apart from each other on the cap layer 106, the first insulating layer 109a formed on the cap layer 106 between the source electrode 107 and the drain electrode 108 and including the first opening 110a, and the gate electrode 114 disposed between the source electrode 107 and the drain electrode 108.

In this field effect transistor, the recessed region 113 is formed in the cap layer 106, and the recessed region 113 is formed by partially removing the cap layer 106 in the direction of the source electrode 107 and the direction of the drain electrode 108 from the opening in a plan view. Further, the gate electrode 114 is disposed above the first insulating layer 109a, partially fitted into the recessed region 113 through the first opening 110a, and Schottky-connected to the barrier layer 104. Further, the gate electrode 114 includes the main portion 114b formed of the gate electrode material, and the gate electrode barrier layer 114a disposed between the main portion 114b and the barrier layer 104 and formed of the conductive material that prevents the gate electrode material from diffusing into the barrier layer 104. Further, the surface of the main portion 114b in a region above the first insulating layer 109a faces the periphery without a layer of a conductive material being formed.

In the first embodiment described above, the gate electrode barrier layer can be thinned to the extent that diffusion of the gate electrode material can be prevented, and substantially the entire gate electrode can be the main portion formed of the gate electrode material. Further, according to the first embodiment, the conductive material layer is not formed in most of regions of the surface of the main portion. As a result, according to the first embodiment, a skin effect in the gate electrode formed of the conductive material containing the high melting point metal can be curbed.

Second Embodiment

Next, a method of manufacturing a field effect transistor according to a second embodiment of the present invention will be described with reference to FIGS. 1A to 1E and FIGS. 2A to 2E. FIGS. 2A to 2E illustrate cross sections parallel to the gate length direction.

First, as illustrated in FIGS. 1A to 1E, as in the first embodiment described above, a buffer layer 102, a channel layer 103, a barrier layer 104, a carrier supply layer 105, and a cap layer 106 are formed on a semiconductor substrate 101, a mesa region 131 is formed, a source electrode 107 and a drain electrode 108 are formed, a first insulating layer 109a and a second insulating layer 109b are formed, a first opening 110a and a second opening 110b are formed, and a first mask pattern 111 and a second mask pattern 112 are formed.

Figure 2A:
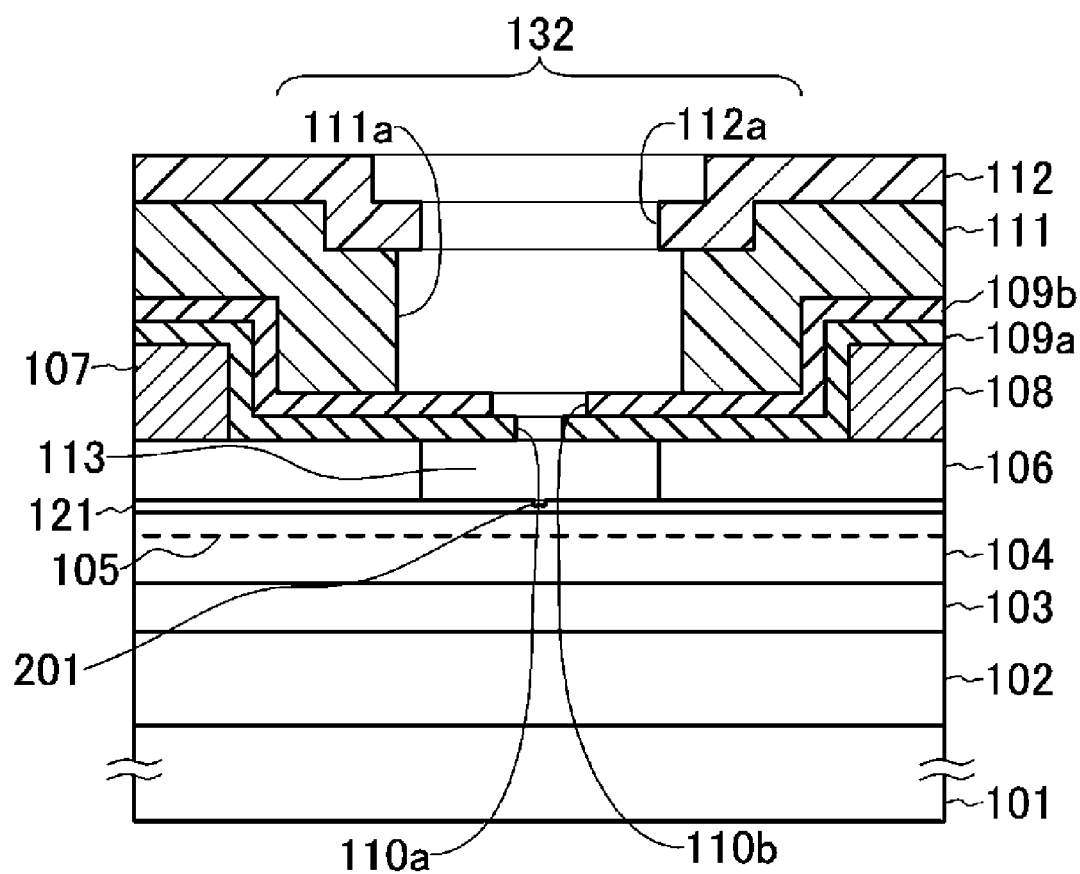
FIG. 2A is a cross-sectional view illustrating a cross section of an element in an intermediate step to describe a method of manufacturing a field effect transistor according to a second embodiment of the present invention.

Next, as illustrated in FIG. 2A, a recess 201 is formed in a stopper layer 121. The recess 201 is formed in a central portion of a region in which the first opening 110a is formed in a plan view. The recess 201 is formed halfway in a thickness direction of the stopper layer 121. Further, the recess 201 may be a through hole that penetrates the stopper layer 121 and reaches the barrier layer 104. For example, the recess 201 can be formed using an atomic layer etching method, a wet etching method, or the like. The atomic layer etching method is a technology for alternately repeating a chemical modification step that acts only on a surface atomic layer of an etching target layer and an etching step of removing only a chemically modified portion to perform etching in atomic layer units.

The formation of the recess 201 makes it possible to further shorten a distance between the gate and the channel, thereby curbing a short channel effect, and greatly improving high-frequency performance. For example, when the distance between the gate and the channel is shortened to about ¼ or less of the fine gate length, good high-frequency characteristics can be achieved.

Figure 2B:
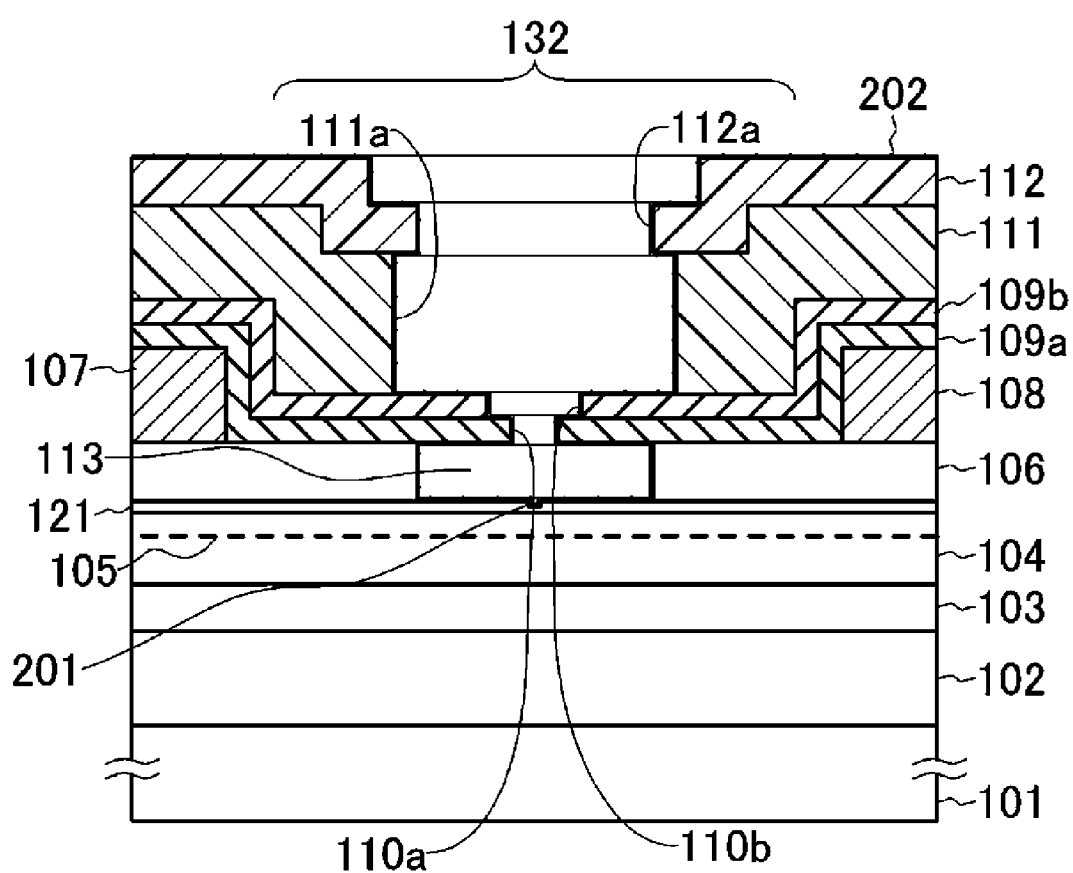
FIG. 2B is a cross-sectional view illustrating a cross section of the element in an intermediate step to describe the method of manufacturing the field effect transistor according to the second embodiment of the present invention.

Then, as illustrated in FIG. 2B, an insulating film 202 is formed. The insulating film 202 is formed to be thinner than a depth of the recess 201. The insulating film 202 serves as a gate insulating layer 203 to be described below. For example, a high dielectric material such as $HfO_2$, $Al_2O_3$, and $TiO_2$ is deposited using a well-known atomic layer deposition method, so that the insulating film 202 can be formed. Using the atomic layer deposition method, the insulating film 202 having few pinholes or interface levels can be formed. In particular, when the plasma-assisted atomic layer deposition method is used, it is possible to perform the deposition at a low temperature while reducing damage to the first mask pattern 111 and the second mask pattern 112.

Figure 2C:
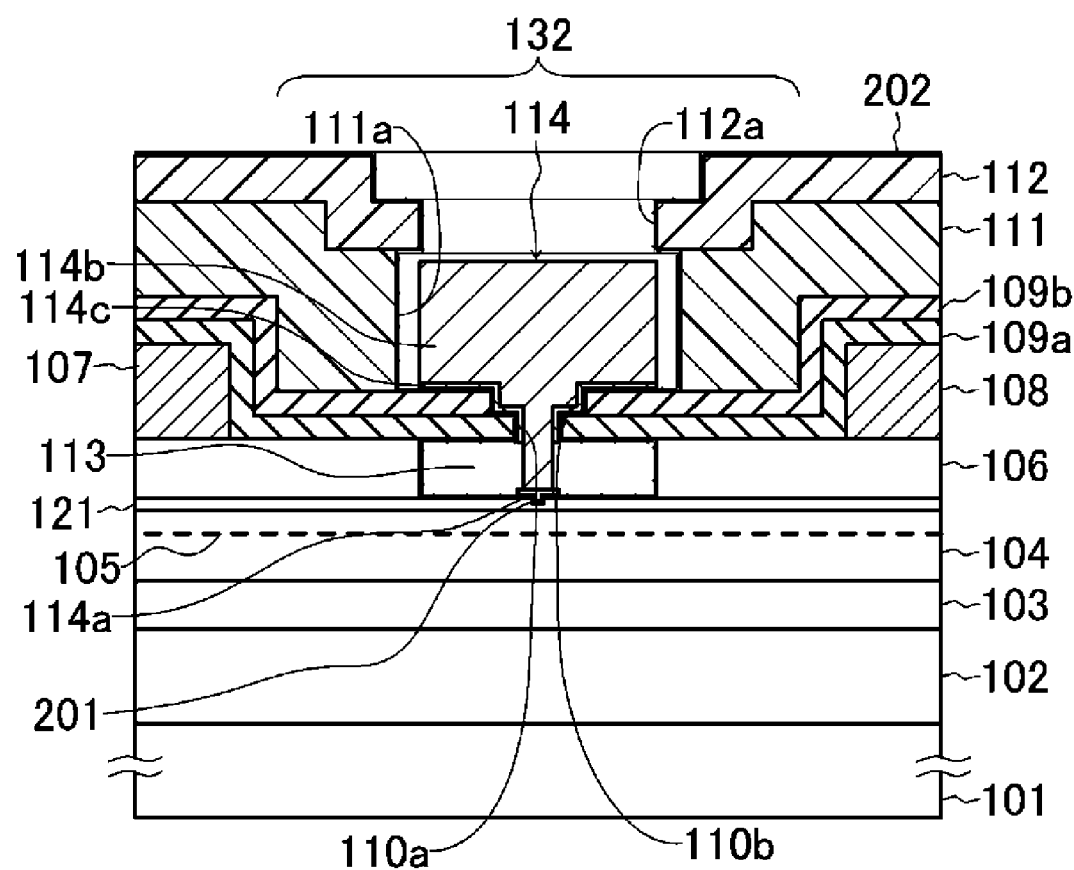
FIG. 2C is a cross-sectional view illustrating a cross section of the element in an intermediate step to describe the method of manufacturing the field effect transistor according to the second embodiment of the present invention.

Then, as illustrated in FIG. 2C, the gate electrode 114 disposed on the first insulating layer 109a (the second insulating layer 109b) and partially fitted into the recessed region 113 through the first opening 110a is formed (a sixth step). The gate electrode 114 includes a main portion 114b formed of the gate electrode material, and a gate electrode barrier layer 114a disposed between the main portion 114b and the barrier layer 104 and formed of a conductive material that prevents the gate electrode material from diffusing into the barrier layer 104, as in the first embodiment described above.

Figure 2D:
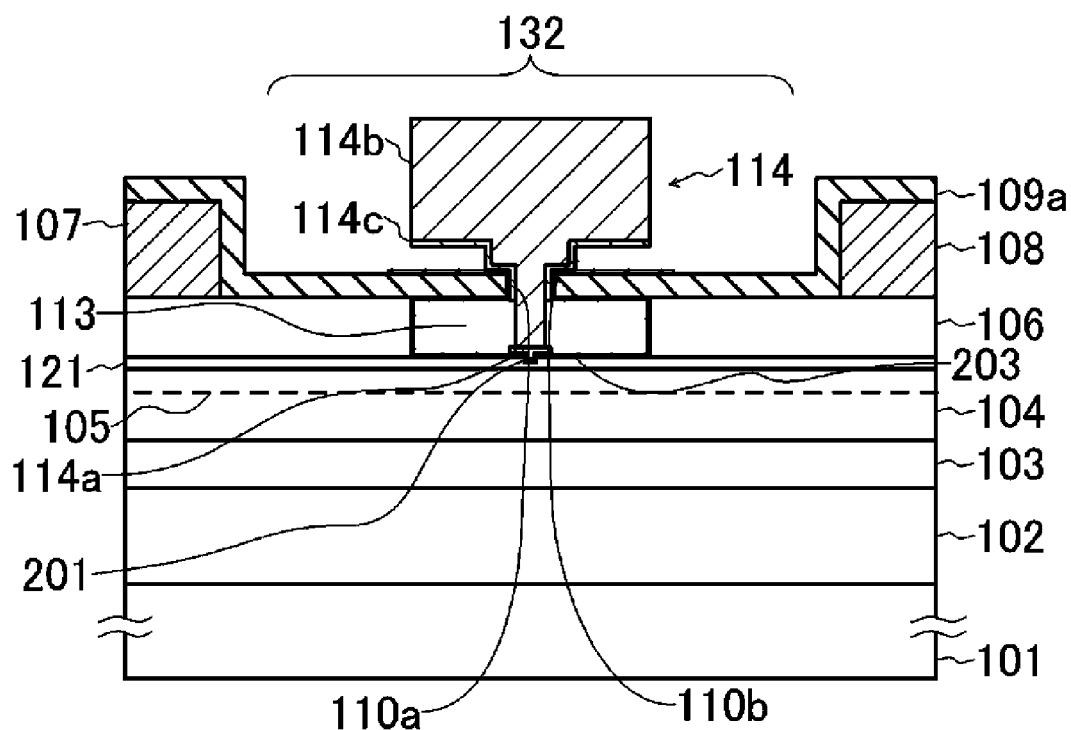
FIG. 2D is a cross-sectional view illustrating a cross section of the element in an intermediate step to describe the method of manufacturing the field effect transistor according to the second embodiment of the present invention.

Then, the first mask pattern 111 and the second mask pattern 112 are removed (FIG. 2D). With the removal of the first mask pattern 111 and the second mask pattern 112, the insulating film 202 formed on the surfaces thereof is removed.

Here, also in the second embodiment, the conductive layer 114c is formed on a side surface of a portion of the main portion 114b together with the formation of the gate electrode barrier layer 114a, as in the first embodiment described above. In a state in which the conductive layer 114c is formed, a skin effect at the time of application of a high frequency causes deterioration of the high-frequency characteristics. Thus, the second insulating layer 109b is removed (a seventh step), and the conductive layer 114c formed on the surface of the main portion 114b in the region above the first insulating layer 109a is removed (an eighth step).

Figure 2E:
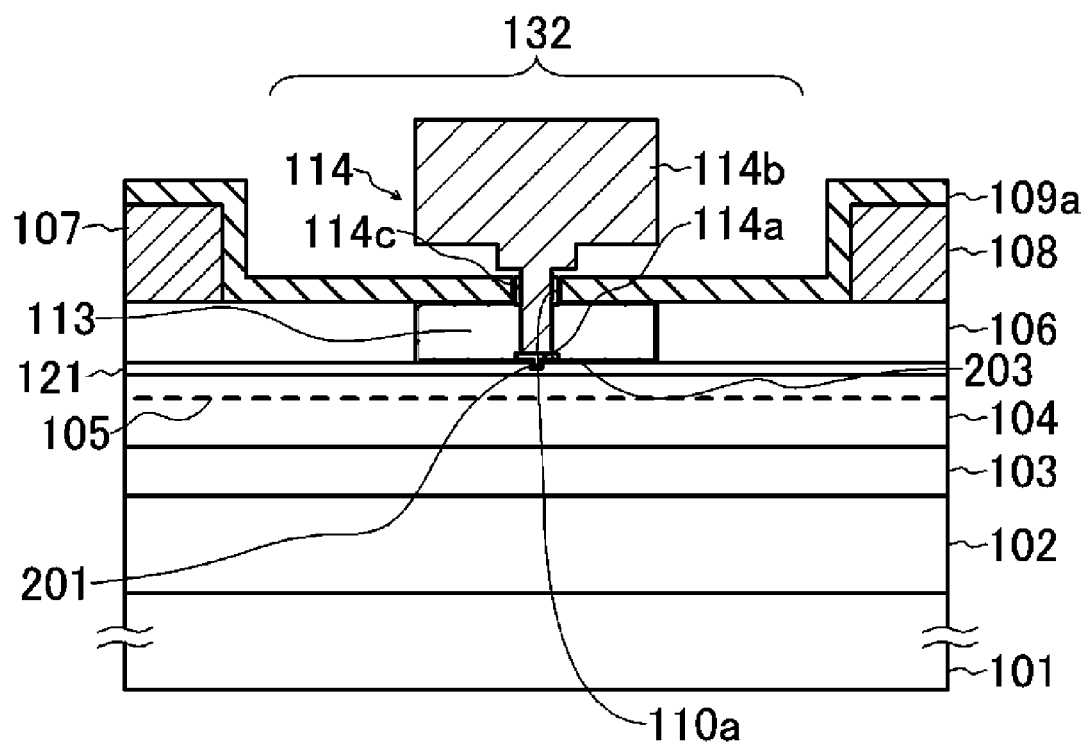
FIG. 2E is a cross-sectional view illustrating a cross section of the element in an intermediate step to describe the method of manufacturing the field effect transistor according to the second embodiment of the present invention.

The above-described removal of the conductive layer 114c can be performed by, for example, plasma etching using a fluorine-based gas such as $SF_6$, $CF_4$, or $C_2F_6$. Through this etching processing, the second insulating layer 109b and the insulating film 202 in the region above the first insulating layer 109a can also be removed together with the removal of the conductive layer 114c. As a result, as illustrated in FIG. 2E, it is possible to achieve a state in which the conductive layer 114c is not formed on the surface of the main portion 114b except for the inside of the first opening 110a of the first insulating layer 109a. Further, the gate insulating layer 203 is formed in a region of a portion above the stopper layer 121 including the recess 201. In the second embodiment, the gate electrode 114 is formed above the barrier layer 104 via the gate insulating layer. It is also possible to perform removal of a portion of the insulating film 202 and removal of the conductive layer 114c using different etching gases and etching conditions in different steps.

The field effect transistor manufacturing method described above makes it possible to obtain the field effect transistor having a so-called recessed gate structure, which includes the buffer layer 102, the channel layer 103, the barrier layer 104, the carrier supply layer 105, and the cap layer 106 formed on the semiconductor substrate 101, the source electrode 107 and the drain electrode 108 formed apart from each other on the cap layer 106, the first insulating layer 109a formed on the cap layer 106 between the source electrode 107 and the drain electrode 108 and including the first opening 110a, and the gate electrode 114 disposed between the source electrode 107 and the drain electrode 108.

In this field effect transistor, the recessed region 113 is formed in the cap layer 106, and the recessed region 113 is formed by partially removing the cap layer 106 in the direction of the source electrode 107 and the direction of the drain electrode 108 from the opening in a plan view. Further, the gate electrode 114 is disposed above the first insulating layer 109a, partially fitted into the recessed region 113 through the first opening 110a, and connected to the barrier layer 104 via the gate insulating layer 203. Further, the gate electrode 114 includes the main portion 114b formed of the gate electrode material, and the gate electrode barrier layer 114a disposed between the main portion 114b and the barrier layer 104 and formed of the conductive material that prevents the gate electrode material from diffusing into the barrier layer 104. Further, the surface of the main portion 114b in a region above the first insulating layer 109a faces the periphery without a layer of a conductive material being formed.

In the second embodiment described above, the gate electrode barrier layer can be thinned to the extent that diffusion of the gate electrode material can be prevented, and a substantially entire gate electrode can be the main portion formed of the gate electrode material, as well. Further, in the second embodiment, the conductive material layer is not formed in most of the regions of the surface of the main portion, as well. As a result, in the second embodiment, a skin effect in the gate electrode formed of the conductive material containing the high melting point metal can be curbed as well.

As described above, according to embodiments of the present invention, because the gate electrode includes the main portion formed of the gate electrode material, and the gate electrode barrier layer formed of the conductive material that prevents the gate electrode material from diffusing into the barrier layer, and the surface of the main portion in the region above the insulating layer faces the periphery without the conductive material being formed, a skin effect in the gate electrode formed of the conductive material containing the high melting point metal can be curbed, thereby achieving a highly reliable field effect transistor having excellent high-frequency characteristics.

The present invention is not limited to the embodiments described above, and it is obvious that many modifications and combinations can be performed by a person having ordinary knowledge in the art in a technical idea of the present invention.

REFERENCE SIGNS LIST

101 Semiconductor substrate
102 Buffer layer
103 Channel layer
104 Barrier layer
105 Carrier supply layer
106 Cap layer
107 Source electrode
108 Drain electrode
109a First insulating layer
109b Second insulating layer
110a First opening
110b Second opening
111 First mask pattern
111a First mask opening
112a Second mask opening
112 Second mask pattern
113 Recessed region
114 Gate electrode
114a Gate electrode barrier layer
114b Main portion
114c Conductive layer (layer of conductive material)
121 Stopper layer
131 Mesa region
132 Recess formation region

The invention claimed is:

1. A method of manufacturing a field effect transistor, the method comprising:
    forming a buffer layer, a channel layer, a barrier layer, a carrier supply layer, and a cap layer on a semiconductor substrate;
    forming a source electrode and a drain electrode apart from each other on the cap layer;
    forming a first insulating layer and a second insulating layer in this order on the cap layer between the source electrode and the drain electrode;
    forming a first opening in the first insulating layer and forming a second opening in the second insulating layer, the second opening being continuous to the first opening in a thickness direction;
    etching the cap layer using the first insulating layer including the first opening and the second insulating layer including the second opening as masks and forming a recessed region in the cap layer under the first opening, the recessed region being formed by partially removing the cap layer in a direction of the source electrode and a direction of the drain electrode from the first opening in a plan view;
    forming a gate electrode by depositing a conductive material and a gate electrode material in this order from above the second insulating layer, the gate electrode being disposed above the first insulating layer, being fitted partially into the recessed region through the first opening, and comprising a main portion comprising the gate electrode material and a gate electrode barrier layer comprising the conductive material, the gate electrode barrier layer being disposed between the main portion and the barrier layer;
    removing the second insulating layer; and
    removing portions of the conductive material formed on a surface of the main portion in a region above the first insulating layer.

2. The method according to claim 1, wherein forming the gate electrode comprises forming the gate electrode using Schottky connection.

3. The method according to claim 1, further comprising forming a gate insulating layer on the barrier layer before forming the gate electrode, wherein the gate electrode is formed on the gate insulating layer.

4. The method according to claim 1, wherein removing the second insulating layer and removing the portions of the conductive material formed on the surface of the main portion are performed simultaneously.

5. The method according to claim 1, wherein forming the gate electrode comprises depositing the conductive material and the gate electrode material using a vacuum vapor deposition method.

6. The method according to claim 1, wherein forming the gate electrode comprises depositing the conductive material and the gate electrode material using a sputtering method.

7. The method according to claim 1, wherein the conductive material prevents the gate electrode material from diffusing into the barrier layer.

8. A field effect transistor comprising:
a buffer layer on a semiconductor substrate;
a channel layer on the buffer layer;
a barrier layer on the channel layer;
a carrier supply layer on the barrier layer;
a cap layer on the carrier supply layer, the cap layer including a recessed region;
a source electrode and a drain electrode disposed apart from each other on the cap layer;
an insulating layer on the cap layer between the source electrode and the drain electrode and including an opening to expose the recessed region of the cap layer; and
a gate electrode disposed above the insulating layer between the source electrode and the drain electrode and partially fitted into the recessed region through the opening in the insulating layer, the gate electrode comprising a main portion comprising a gate electrode material and a gate electrode barrier layer disposed between the main portion and the barrier layer and comprising a conductive material, wherein an uppermost surface of the gate electrode barrier layer is below a lowermost surface of the insulating layer, and wherein portions of lowermost sidewalls of the main portion that extend above the opening in the insulating layer face a periphery without the conductive material thereon.

9. The field effect transistor according to claim 8, wherein the gate electrode barrier layer is configured to prevent the gate electrode material from diffusing into the barrier layer.

10. The field effect transistor according to claim 8, wherein the gate electrode has a Schottky connection structure.

11. The field effect transistor according to claim 8, further comprising a gate insulating layer on the barrier layer, wherein the gate electrode is on the gate insulating layer.

12. The field effect transistor according to claim 8, wherein the recessed region defines an air gap along sidewalls of the gate electrode barrier layer and along sidewalls of a portion of the main portion of the gate electrode fitted into the recessed region.

13. The field effect transistor according to claim 8, wherein the conductive material is disposed on side surfaces of the main portion of the gate electrode in contact with end faces of the insulating layer at the opening in the insulating layer, and wherein an uppermost surface of the conductive material disposed on the side surfaces of the main portion of the gate electrode is coplanar with an uppermost surface of the insulating layer in a region adjacent to the opening in the insulating layer.

14. The field effect transistor according to claim 8, further comprising a stopper layer on the carrier supply layer, wherein the cap layer is on the stopper layer, wherein a second recess is disposed in an upper surface of the stopper layer in a region underlying the gate electrode barrier layer, and wherein a portion of the gate electrode barrier layer is disposed in the second recess.

15. The field effect transistor according to claim 14, further comprising an insulating film disposed between the stopper layer and the gate electrode barrier layer, wherein a thickness of the insulating film is smaller than a depth of the second recess.

16. The field effect transistor according to claim 8, wherein each sidewall of the main portion disposed above the insulating layer and overlying the recessed region faces the periphery without the conductive material thereon.

* * * * *